(12) United States Patent
Cheng et al.

(10) Patent No.: US 10,522,438 B2
(45) Date of Patent: Dec. 31, 2019

(54) PACKAGE STRUCTURE HAVING UNDER BALL RELEASE LAYER AND MANUFACTURING METHOD THEREOF

(71) Applicant: Industrial Technology Research Institute, Hsinchu (TW)

(72) Inventors: Chun-Yi Cheng, Hsinchu (TW); Wei-Yuan Cheng, Hsinchu County (TW); Shu-Wei Kuo, Hsinchu County (TW); Yu-Jhen Yang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 253 days.

(21) Appl. No.: 15/597,124

(22) Filed: May 16, 2017

(65) Prior Publication Data

US 2018/0122694 A1 May 3, 2018

Related U.S. Application Data

(60) Provisional application No. 62/415,521, filed on Nov. 1, 2016.

(30) Foreign Application Priority Data

Feb. 17, 2017 (TW) .............................. 106105304 A (51) Int. Cl.
*H01L 23/31* (2006.01)
*H01L 21/02* (2006.01)
(Continued)

(52) U.S. Cl.
CPC .... *H01L 23/3107* (2013.01); *H01L 21/02172* (2013.01); *H01L 21/4846* (2013.01);
(Continued)

(58) Field of Classification Search
CPC ... H01L 23/3107; H01L 2224/023–024; H01L 23/49816; H01L 24/12;
(Continued)

(56) References Cited

U.S. PATENT DOCUMENTS

| 7,985,631 B2 | 7/2011 | Zhang |
| 9,142,514 B2 | 9/2015 | Camacho et al. |

(Continued)

FOREIGN PATENT DOCUMENTS

| CN | 1980542 | 6/2007 |
| CN | 101241889 | 8/2008 |

(Continued)

OTHER PUBLICATIONS

Shijian Luo et al., "Study on Surface Tension and Adhesion for Flip Chip Packaging," 2001 International Symposium on Advanced Packaging Materials: Processes, Properties and Interfaces, IEEE, Mar. 11-14, 2001, pp. 299-304.

(Continued)

*Primary Examiner* — Scott B Geyer
(74) *Attorney, Agent, or Firm* — JCIPRNET (57) ABSTRACT

A package structure includes a redistribution layer, a chip, an encapsulant, a plurality of under ball release layers, and a plurality of solder balls. The redistribution layer includes a first surface, a second surface opposite to the first surface, and a patterned circuit layer, wherein the patterned circuit layer includes a plurality of pads protruding from the first surface. The chip is disposed on the second surface and electrically connected to the patterned circuit layer. The encapsulant is disposed on the second surface and encapsulates the chip. The under ball release layers cover the pads respectively. The solder balls are disposed on the under ball release layers and electrically connected to the pads.

11 Claims, 8 Drawing Sheets

(51) Int. Cl.
*H01L 21/48* (2006.01)
*H01L 21/768* (2006.01)
*H01L 23/00* (2006.01)

(52) U.S. Cl.
CPC .. *H01L 21/76832* (2013.01); *H01L 21/76838* (2013.01); *H01L 24/11* (2013.01); *H01L 24/12* (2013.01); *H01L 2224/05008* (2013.01); *H01L 2224/05022* (2013.01); *H01L 2924/01013* (2013.01); *H01L 2924/01022* (2013.01)

(58) Field of Classification Search
CPC ........... H01L 24/16; H01L 2224/05008; H01L 2224/05022; H01L 2224/16227; H01L 2224/81385; H01L 2924/15311; H01L 2924/181
See application file for complete search history.

(56) References Cited

U.S. PATENT DOCUMENTS

| | | |
|---|---|---|
| 2006/0115931 A1 | 6/2006 | Hsu |
| 2014/0077361 A1 | 3/2014 | Lin et al. |
| 2014/0138816 A1 | 5/2014 | Lu et al. |
| 2014/0138817 A1* | 5/2014 | Paek ................... H01L 24/10 257/737 |
| 2014/0252594 A1 | 9/2014 | Meng et al. |
| 2015/0228594 A1 | 8/2015 | Alvarado et al. |
| 2015/0318262 A1* | 11/2015 | Gu ................... H01L 23/49811 257/738 |
| 2015/0348957 A1 | 12/2015 | Lin et al. |
| 2015/0380334 A1 | 12/2015 | Hu et al. |
| 2016/0013148 A1* | 1/2016 | Lin ................... H01L 23/552 257/773 |
| 2016/0071816 A1 | 3/2016 | Huang et al. |
| 2016/0163566 A1 | 6/2016 | Chen et al. |
| 2016/0163578 A1* | 6/2016 | Yu ................... H01L 23/3107 257/738 |

FOREIGN PATENT DOCUMENTS

| | | |
|---|---|---|
| CN | 101290917 | 10/2008 |
| CN | 101335217 | 12/2008 |
| CN | 101720165 | 6/2010 |
| CN | 101969051 | 2/2011 |
| CN | 102779767 | 11/2012 |
| CN | 104377182 | 2/2015 |
| CN | 104465575 | 3/2015 |
| CN | 104681531 | 6/2015 |
| CN | 105261606 | 1/2016 |
| CN | 105514086 | 4/2016 |
| CN | 105590915 | 5/2016 |
| CN | 105789176 | 7/2016 |
| TW | 201546975 | 12/2015 |
| TW | I549249 | 9/2016 |

OTHER PUBLICATIONS

"Notice of Allowance of Taiwan Counterpart Application," dated Aug. 8, 2018, pp. 1-4.
"Office Action of Taiwan Related Application No. 106114549", dated Aug. 2, 2018, pp. 1-5.
"Office Action of China Counterpart Application," dated Apr. 10, 2019, p. 1-p. 8.
"Office Action of China Related Application No. 201710437309.0", dated Apr. 11, 2019, p. 1-p. 10.

* cited by examiner

FIG. 15

PACKAGE STRUCTURE HAVING UNDER BALL RELEASE LAYER AND MANUFACTURING METHOD THEREOF

CROSS-REFERENCE TO RELATED APPLICATION

This application claims the priority benefits of U.S. provisional application Ser. No. 62/415,521, filed on Nov. 1, 2016 and Taiwan application serial no. 106105304, filed on Feb. 17, 2017. The entirety of each of the above-mentioned patent applications is hereby incorporated by reference herein and made a part of this specification.

BACKGROUND

Technical Field

The disclosure relates to a package structure and a manufacturing method thereof.

Description of Related Art

Chip package is used for the purposes of protecting an exposed chip, reducing the density of chip contacts, and providing better heat dissipation for the chip. However, as the number of chip contacts continues to increase, the downsizing of the chip area makes it more and more difficult to redistribute all the contacts as a surface matrix on the chip surface. Even if the chip surface can accommodate all the contacts, the gap between the contacts would be too small and affect the electrical reliability in the subsequent soldering process for solder balls.

Therefore, in general package technology, an encapsulant is used to encapsulate the chip first, so as to increase the chip area, in which the active surface of the chip and the bottom surface of the encapsulant are exposed outside. Then, a redistribution layer is formed on the active surface of the chip and the bottom surface of the encapsulant, and solder balls are formed on the contacts of the redistribution layer respectively for electrically connecting the chip with external contacts. Such a technique, however, may easily result in overflow during package and cause the encapsulant to extend onto a portion of the active surface of the chip and contaminate the active surface of the chip.

Now the research focuses on developing a technique, by which the redistribution layer is formed on a carrier first and then the chip is disposed on the redistribution layer, and after the encapsulant is disposed to encapsulate the chip, the carrier is removed. In such a case, however, the redistribution layer exposed by removal of the carrier is planar and has less bonding strength, which is difficult to perform ball planting.

SUMMARY

An embodiment of the disclosure provides a package structure and a manufacturing method thereof, by which a bonding area for bonding solder balls is increased in the manufacturing method of forming a redistribution layer prior to disposing a chip, so as to improve reliability of the package structure.

According to an embodiment of the disclosure, a package structure includes a redistribution layer, a chip, an encapsulant, a plurality of under ball release layers, and a plurality of solder balls. The redistribution layer includes a first surface, a second surface opposite to the first surface, and a patterned circuit layer. The patterned circuit layer includes a plurality of pads protruding from the first surface. The chip is disposed on the second surface and electrically connected to the patterned circuit layer. The encapsulant is disposed on the second surface and encapsulates the chip. The under ball release layers respectively cover the pads protruding from the first surface. The solder balls are respectively disposed on the under ball release layers and electrically connected to the pads.

According to an embodiment of the disclosure, a package structure includes a redistribution layer, a chip, an encapsulant, a plurality of under ball release layers, and a plurality of solder balls. The redistribution layer includes a first surface, a second surface opposite to the first surface, and a patterned circuit layer disposed on the first surface. The patterned circuit layer includes a plurality of pads. An outer surface of each of the pads is coplanar with the first surface. The chip is disposed on the second surface and electrically connected to the patterned circuit layer. The encapsulant is disposed on the second surface and encapsulates the chip. The under ball release layers are disposed on the first surface and respectively cover the pads. The solder balls are respectively disposed on the under ball release layers and electrically connected to the pads. An area of a contact surface between each of the under ball release layers and each of the solder balls is greater than an area of the outer surface of each of the pads.

According to an embodiment of the disclosure, a manufacturing method of a package structure includes the following. A release layer is formed on a carrier. A redistribution layer is formed on the release layer. The redistribution layer includes a first surface connected to the release layer, a second surface opposite to the first surface, and a patterned circuit layer. The patterned circuit layer includes a plurality of pads disposed on the first surface. An adhesion between the release layer and the redistribution layer is greater than an adhesion between the release layer and the carrier. A chip is disposed on the second surface. The chip is electrically connected to the patterned circuit layer. An encapsulant is formed on the second surface and encapsulates the chip. The carrier is removed and the release layer is patterned to form a plurality of under ball release layers covering the pads. A plurality of solder balls are formed on the under ball release layers, and the solder balls are electrically connected to the pads.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It should be understood that the foregoing and other detailed descriptions, features, and effects are intended to be described more comprehensively by providing embodiments accompanied with drawings hereinafter. In the following embodiments, wording used to indicate directions, such as "up," "down," "front," "back," "left," and "right," merely refers to directions in the accompanying drawings. Therefore, the directional wording is used to illustrate rather than limit the disclosure. Moreover, the same or similar reference numerals represent the same or similar elements in the following embodiments.

FIG. 1 to FIG. 9 are cross-sectional views showing a manufacturing method of a package structure according to an embodiment of the disclosure. According to this embodiment, the manufacturing method of the package structure includes the following. First, referring to FIG. 1, a plurality of adhesive layers 110 are formed on a carrier 105, wherein a gap is maintained between any two adjacent adhesive layers 110. In this embodiment, the carrier 105 may be a glass carrier, a wafer carrier, or a stainless steel carrier. A material of the adhesive layers 110 may include a metal, an organic polymer material, or an inorganic molecular material. The material of the adhesive layers 110 may include titanium, and the adhesive layers 110 are formed on the carrier 105 by a sputtering process, for example. Nevertheless, this embodiment is merely an example, and this disclosure is not intended to limit the materials and forming methods of the carrier 105 and the adhesive layers 110.

Figure 1:
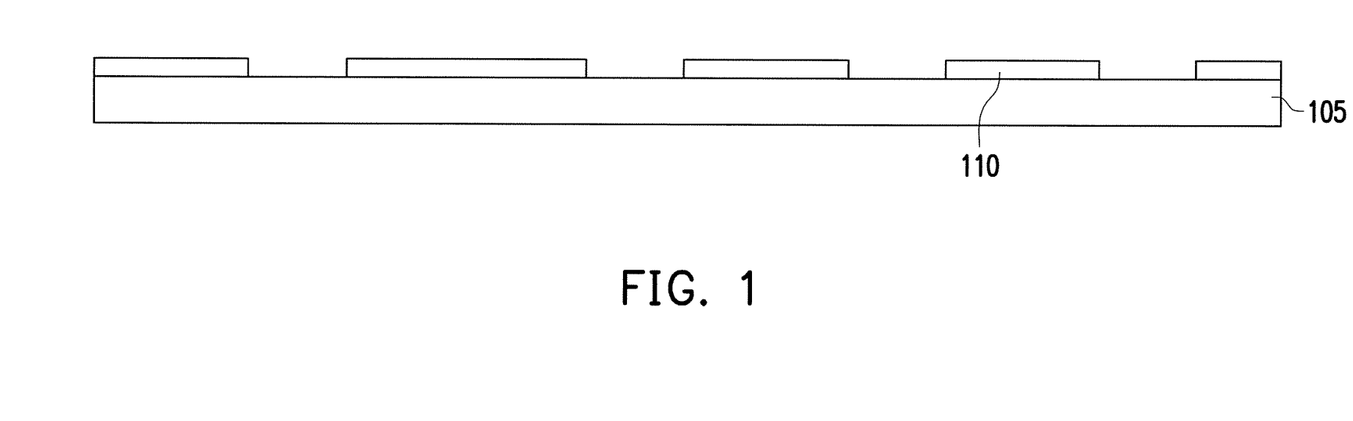
FIG. 1 to FIG. 9 are cross-sectional views showing a manufacturing method of a package structure according to an embodiment of the disclosure.
Figure 2:
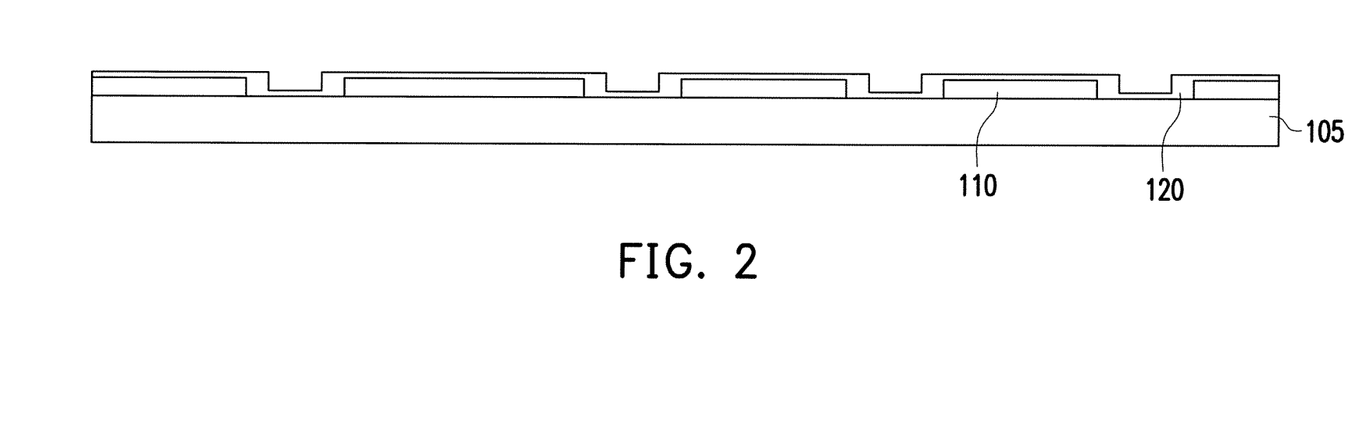

Next, referring to FIG. 2, a release layer 120 is formed on the carrier 105, wherein the release layer 120 covers the adhesive layers 110 and a surface of the carrier 105 exposed by the adhesive layers 110. In this embodiment, a thickness of the release layer 120 is in a range of 50 nm to 300 nm. A material of the release layer 120 may include a metal, a metal oxide, a metal alloy, or any combination of the foregoing. The material of the release layer 120 may be an electrically conductive material, such as copper or aluminum, and the release layer 120 is formed on the carrier 105 by a sputtering process, for example. An adhesion between the release layer 120 and a patterned circuit layer 132 formed thereafter may be greater than an adhesion between the release layer 120 and the carrier 105.

Figure 4:
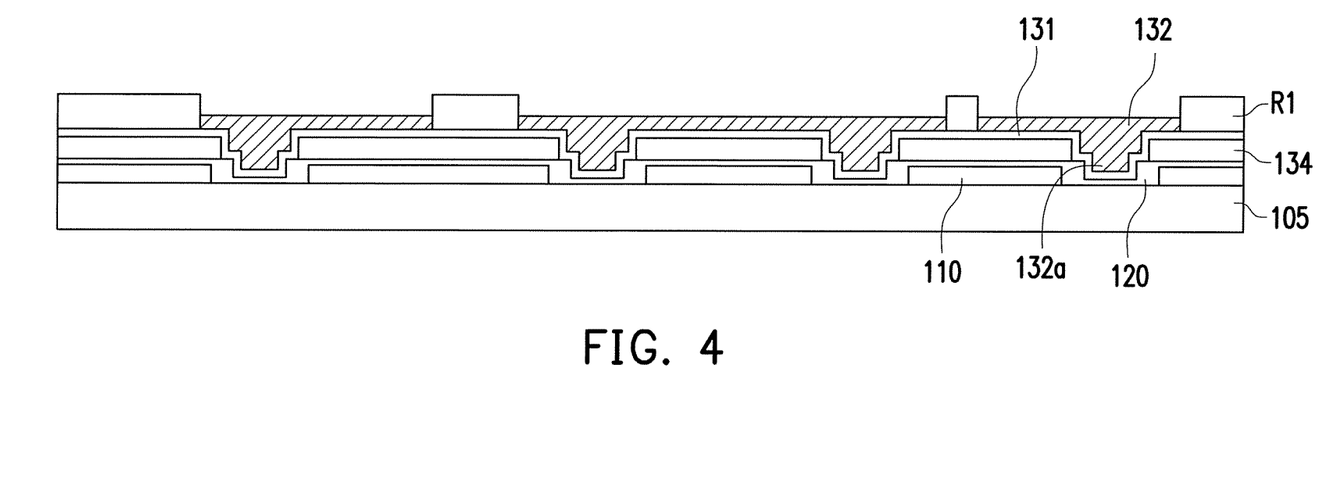
Figure 5:
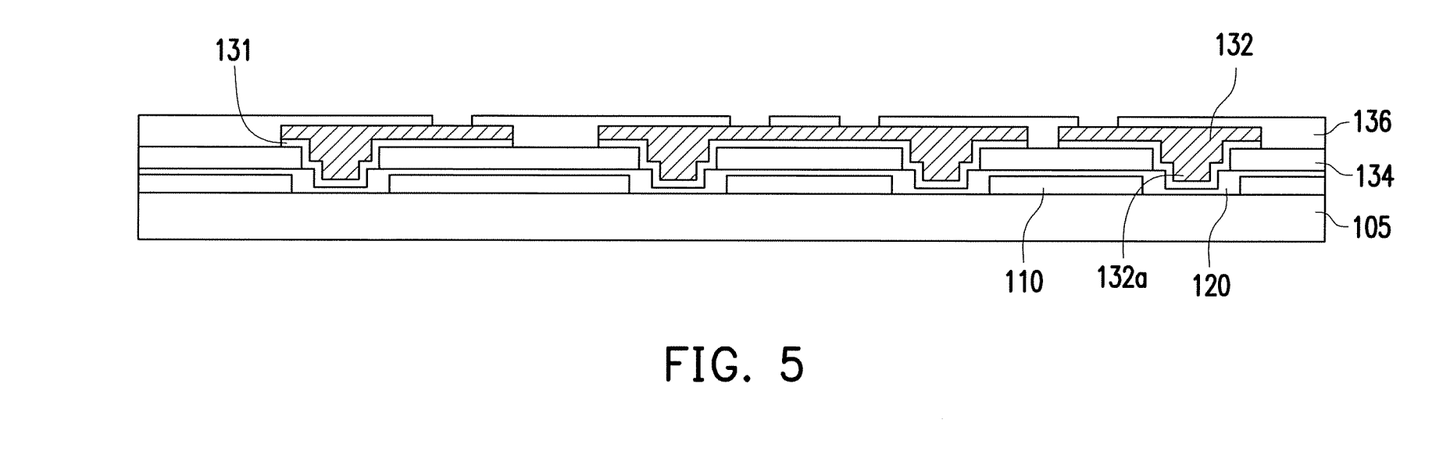
Figure 6:
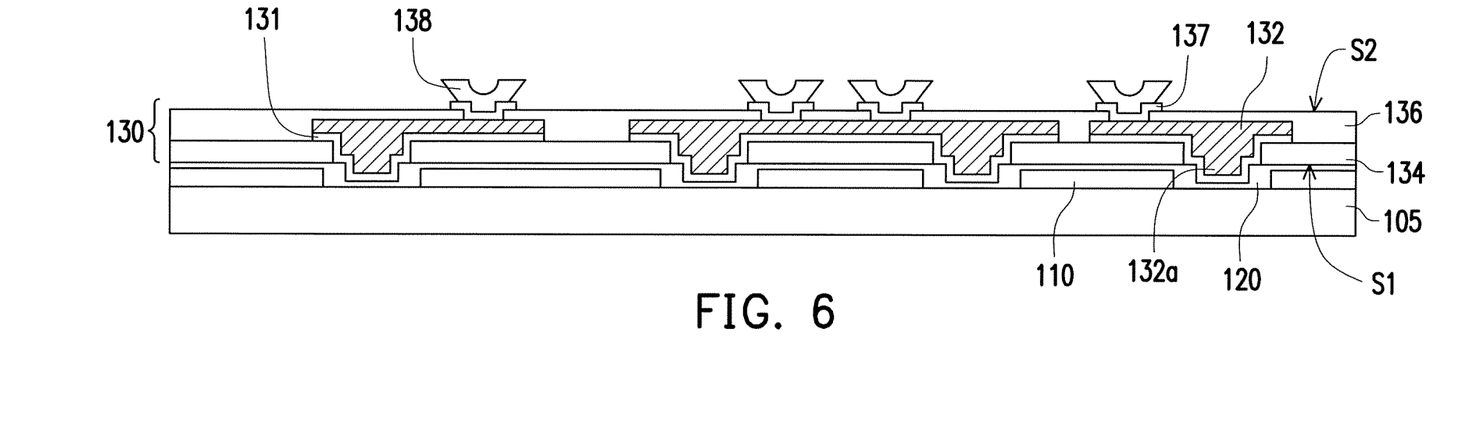

Then, referring to FIG. 3 to FIG. 6, a redistribution layer 130 is formed on the release layer 120, wherein the redistribution layer 130 includes a first surface S1 connected to the release layer 120, a second surface S2 opposite to the first surface S1, and the patterned circuit layer 132, as shown in FIG. 6. The patterned circuit layer 132 includes a plurality of pads 132a disposed on the first surface S1. In this embodiment, the pads 132a protrude from the first surface S1 of the redistribution layer 130.

Figure 3:
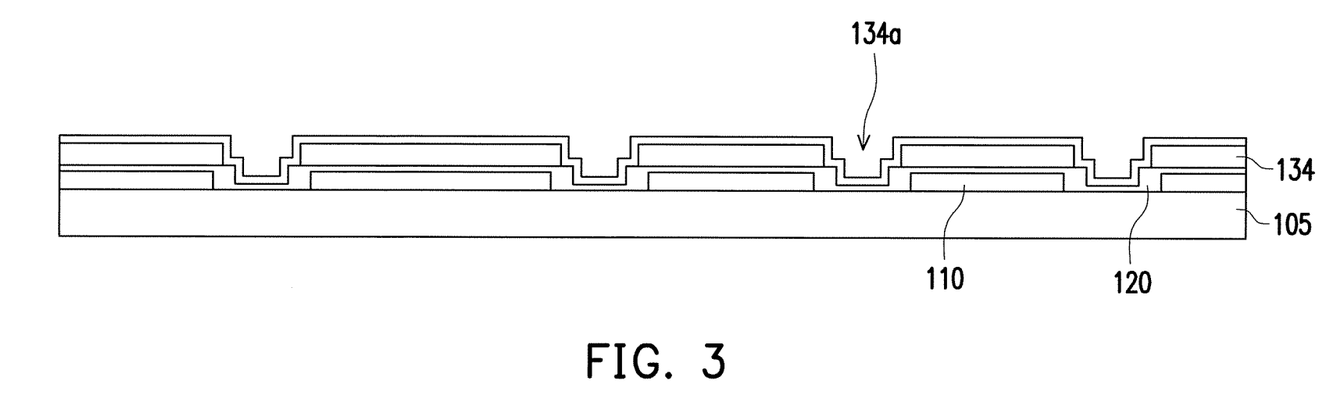

A method of forming the redistribution layer 130 includes the following. First, a first dielectric layer 134 is formed on the release layer 120, as shown in FIG. 3, wherein the first dielectric layer 134 includes a plurality of openings 134a and the first surface S1. The first surface S1 here is the first surface S1 of the redistribution layer 130. In addition, the openings 134a expose the gaps among the adhesive layers 110. Next, a seed layer 131 is formed on the first dielectric layer 134, and the seed layer 131 covers the openings 134a of the first dielectric layer 134 and a portion of the adhesive layers 110 exposed by the openings 134a. Thereafter, a patterned photoresist layer R1 is formed on the first dielectric layer 134, as shown in FIG. 4, and openings of the patterned photoresist layer R1 expose the openings 134a of the first dielectric layer 134 and a portion of the seed layer 131 exposed by the openings 134a. Then, the patterned circuit layer 132 is formed in the openings of the patterned photoresist layer R1, as shown in FIG. 4, by performing electroplating with the seed layer 131 as a conductive path, wherein the patterned circuit layer 132 fills the openings 134a of the first dielectric layer 134 and protrudes on the first surface S1 of the first dielectric layer 134 through the openings 134a to form the pads 132a protruding from the first surface S1.

Thereafter, referring to FIG. 5, the patterned photoresist layer R1 is removed and the portion of the seed layer 131 exposed by the patterned photoresist layer R1 is etched and removed, and then a second dielectric layer 136 is formed on the first dielectric layer 134, wherein the second dielectric layer 136 includes the second surface S2 and a plurality of openings exposing a portion of the patterned circuit layer 132. Next, referring to FIG. 6, an under ball metallization layer 138 is formed on the openings of the second dielectric layer 136, and the under ball metallization layer 138 is electrically connected to the patterned circuit layer 132 through the openings of the second dielectric layer 136. Accordingly, the manufacturing of the redistribution layer 130 is substantially completed.

A method of forming the under ball metallization layer 138 includes the following. Similar to the method of forming the patterned circuit layer 132 as described above, first, a seed layer 137 is formed on the second dielectric layer 136, and the seed layer 137 covers the openings of the second dielectric layer 136 and the patterned circuit layer 132 exposed by the openings. Then, a patterned photoresist layer is formed on the second dielectric layer 136, and openings of the patterned photoresist layer expose the openings of the second dielectric layer 136 and a portion of the seed layer 137 exposed by the openings. Thereafter, the under ball metallization layer 138 is formed in the openings of the patterned photoresist layer, as shown in FIG. 5, by performing electroplating with the seed layer 137 as a conductive path. Then, the patterned photoresist layer is removed and the portion of the seed layer 137 exposed by the patterned photoresist layer is etched and removed, so as to complete the under ball metallization layer 138.

Figure 7:
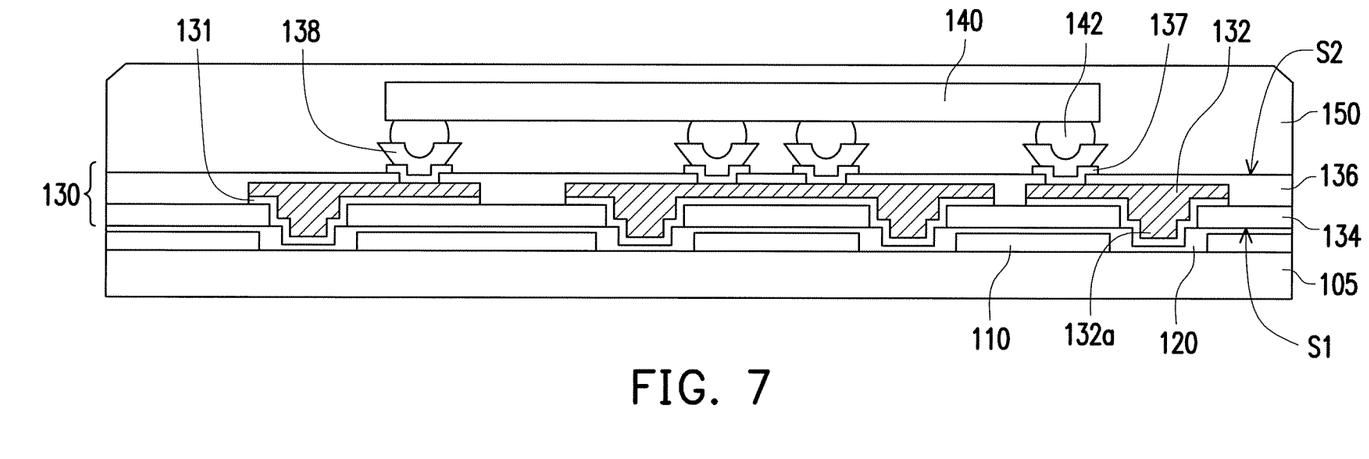

Next, referring to FIG. 7, a chip 140 is disposed on the second surface S2 of the redistribution layer 130. In this embodiment, the chip 140 is disposed on the under ball metallization layer 138 of the redistribution layer 130 by flip-chip bonding with use of a plurality of conductive bumps 142, and electrically connected to the patterned circuit layer 132 via the under ball metallization layer 138. Then, an encapsulant 150 is formed on the second surface S2 of the redistribution layer 130 to encapsulate the chip 140.

Figure 8:
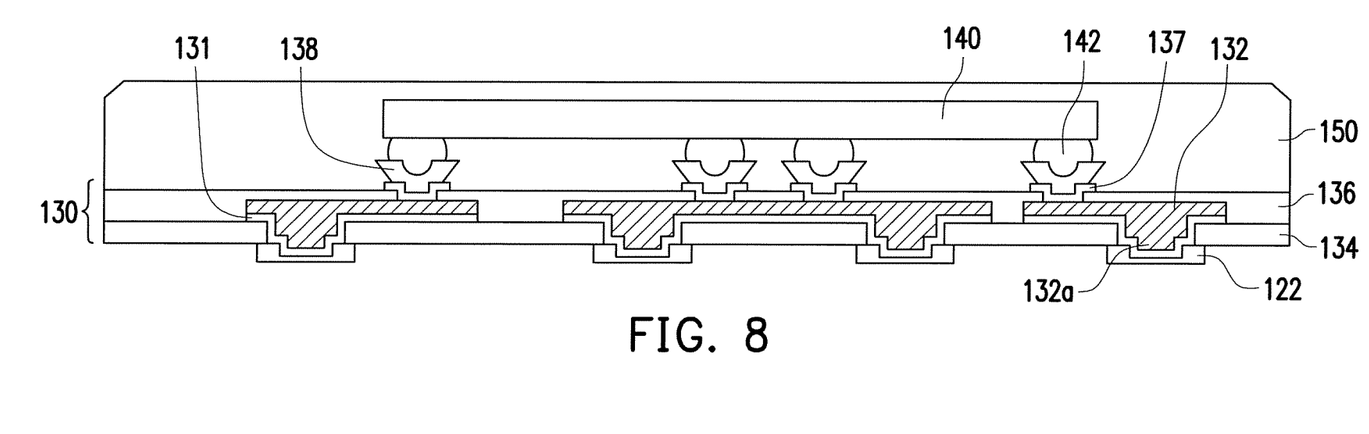

Thereafter, referring to FIG. 8, the carrier 105 is removed and the release layer 120 is patterned to form a plurality of under ball release layers 122 covering the pads 132a. In this embodiment, an adhesion between the release layer 120 and the pads 132a of the redistribution layer 130 is greater than an adhesion between the release layer 120 and the carrier 105, and an adhesion between the release layer 120 and the adhesive layers 110 is greater than an adhesion between the release layer 120 and the first dielectric layer 134 of the redistribution layer 130. Thus, when the carrier 105 and the adhesive layers 110 are separated from the release layer 120, a portion of the release layer 120 in contact with the first dielectric layer 134 of the redistribution layer 130 is removed along with the adhesive layers 110, so as to remove the portion of the release layer 120 in contact with the adhesive layers 110, while the portion of the release layer 120 in contact with the pads 132a remains on the pads 132a due to stronger adhesion. Thereby, the under ball release layers 122 covering the pads 132a are formed. Therefore, in this embodiment, the release layer 120 is patterned as the carrier 105 is removed, so as to form the under ball release layers 122 covering the pads 132a. In this embodiment, the under ball release layers 122 respectively cover the pads 132a protruding from the first surface S1.

In addition, since removal of the carrier 105 may easily apply stress on the package structure and results in breakage of the circuit in the redistribution layer 130, in this embodiment, a material stiffness of the first dielectric layer 134 of the redistribution layer 130 may be less than a material stiffness of the second dielectric layer 136. Namely, in the redistribution layer 130, the dielectric layer closer to the carrier 105 is softer than the dielectric layer away from the carrier 105, so as to help absorb the stress applied on the dielectric layer away from the carrier 105 due to removal of the carrier 105, and thereby prevents breakage of the circuit in the dielectric layer. For example, since an inorganic material is harder than an organic material, in an embodiment, the material of the first dielectric layer 134 may include an organic material or a mixture of organic and inorganic materials while the material of the second dielectric layer 136 may include an inorganic material. Alternatively, in another embodiment, the material of the first dielectric layer 134 may be an organic material while the material of the second dielectric layer 136 may include an inorganic material or a mixture of organic and inorganic materials. In this embodiment, the material of each of the under ball release layers 122 may include an organic material.

Figure 9:
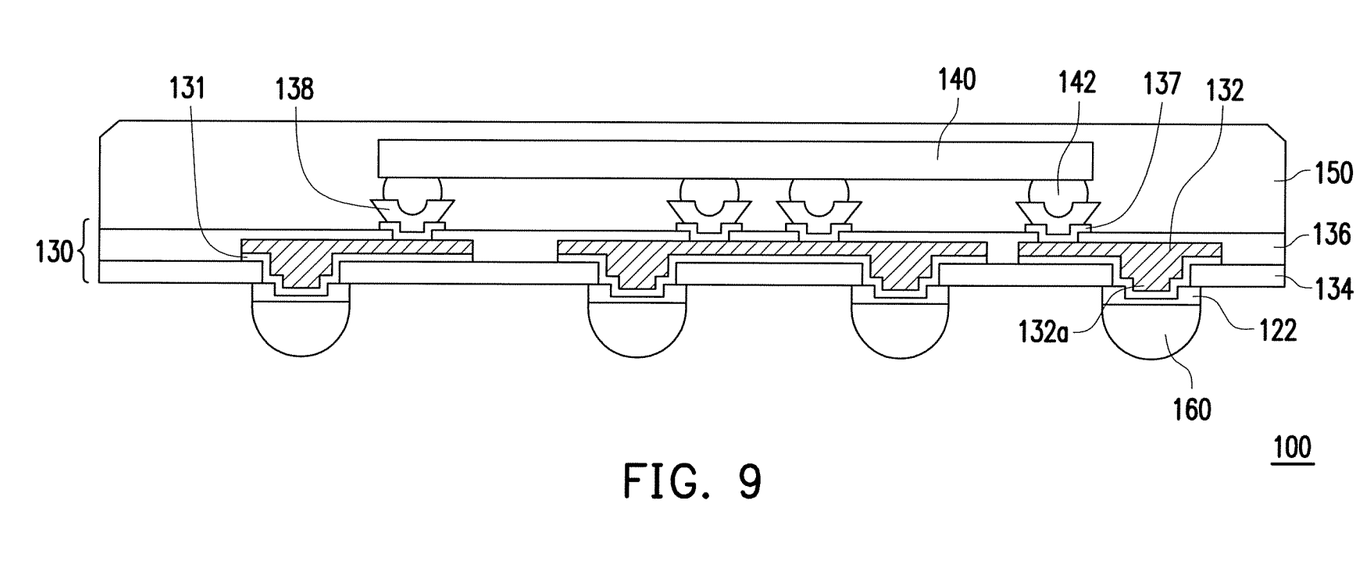

Next, referring to FIG. 9, a plurality of solder balls 160 are formed on the under ball release layers 122, wherein the solder balls 160 and the pads 132a are electrically connected via the under ball release layers 122. Accordingly, the manufacturing method of the package structure 100 of this embodiment is substantially completed. In this embodiment, the under ball release layer 122 includes a contact surface in contact with the solder ball 160. The pad 132a includes an outer surface away from the first surface S1. An area of the contact surface of the under ball release layer 122 is greater than an area of the outer surface of the pad 132a. With this configuration, the manufacturing method of the package structure 100 of this embodiment, in which the redistribution layer 130 is formed prior to disposition of the chip 140, is able to form the under ball release layers 122 covering the pads 132a protruding from the first surface S1 when the carrier 105 is removed. Moreover, since the contact area between the under ball release layer 122 and the solder ball 160 is greater than the area of the outer surface of the pad 132a, the bonding area of the solder ball 160 is increased. Furthermore, the surface roughness of the under ball release layer 122 formed by sputtering is less than the surface roughness of the pad 132a formed by electroplating. Therefore, the bonding strength of the solder ball 160 is enhanced, so as to facilitate ball formation in the subsequent reflow process and improve the reliability of the package structure 100. In this embodiment, the surface roughness of the under ball release layer 122 formed by sputtering is about 0.2 μm while the surface roughness of the pad 132a formed by electroplating is about 1.6 μm. Nevertheless, this embodiment is merely an example, and the actual numerical range may change due to improvement of the manufacturing technology or product requirement. Thus, this disclosure is not limited to the above.

FIG. 10 to FIG. 15 are cross-sectional views showing a manufacturing method of a package structure according to another embodiment of the disclosure. The manufacturing method of a package structure 100a of this embodiment is similar to the manufacturing method of the package structure 100 of the above embodiment. Therefore, the reference numerals and part of contents of the above embodiment are also used to describe this embodiment, wherein the same reference numerals are used to represent the same or similar elements, and thus descriptions of repeated technical contents will be omitted. Please refer to the descriptions of the above embodiment for the omitted contents, which will not be repeated hereinafter. A difference between the manufacturing method of the package structure 100a of this embodiment and the manufacturing method of the package structure 100 of the above embodiment is explained below.

Figure 10:
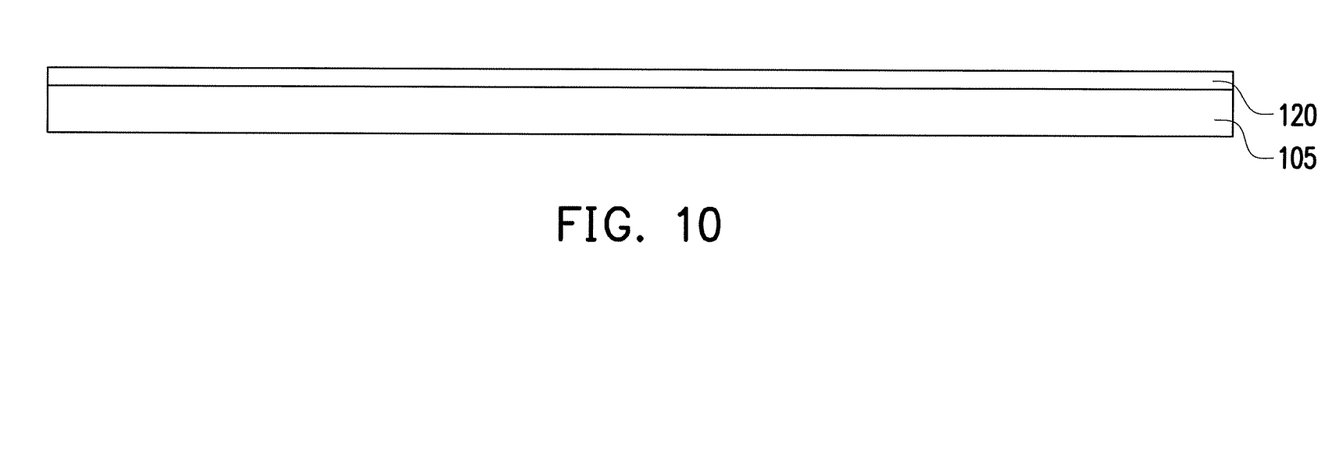
FIG. 10 to FIG. 15 are cross-sectional views showing a manufacturing method of a package structure according to an embodiment of the disclosure.
Figure 11:
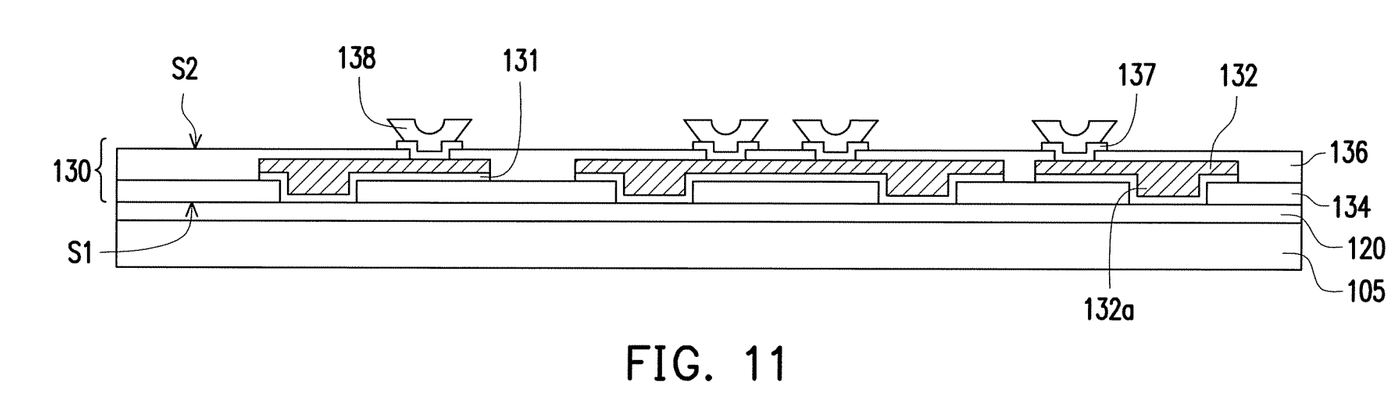
Figure 12:
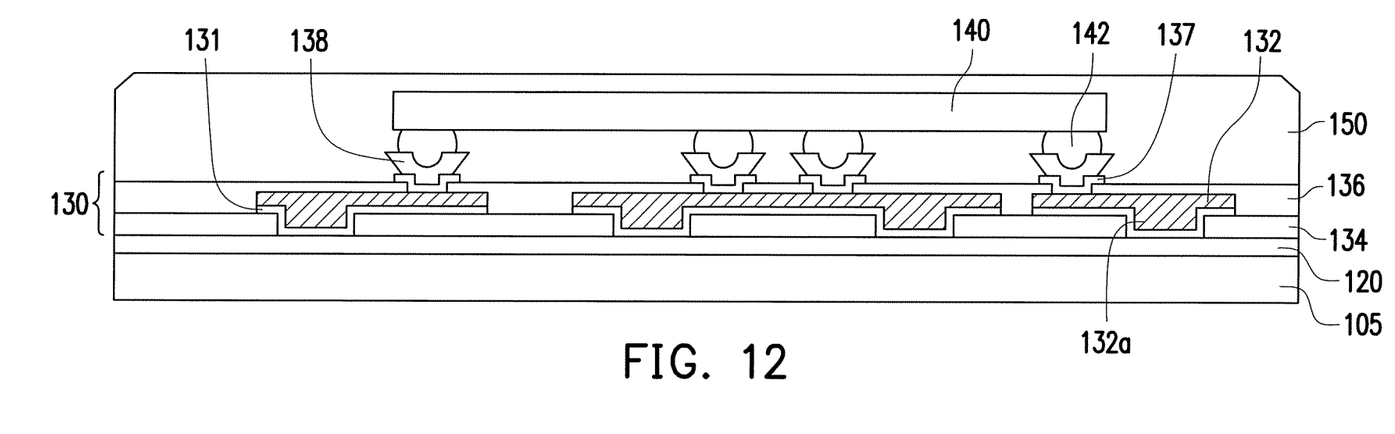

In this embodiment, the release layer 120 may completely cover an upper surface of the carrier 105, as shown in FIG. 10. The material of the release layer 120 may include a metal, a metal oxide, a metal alloy, or any combination of the foregoing. Then, the redistribution layer 130 as shown in FIG. 11 is formed on the release layer 120 by performing processes similar to FIG. 3 to FIG. 6 of the above embodiment. In this embodiment, the redistribution layer 130 includes a first surface S1, a second surface S2 opposite to the first surface S1, and a patterned circuit layer 132 disposed on the first surface S1. The patterned circuit layer 132 includes a plurality of pads 132a.

A method of forming the redistribution layer 130 includes the following. A first dielectric layer 134 is formed on the release layer 120, as shown in FIG. 11, wherein the first dielectric layer 134 includes a plurality of openings (e.g. the openings 134a as shown in FIG. 3), and the openings 134a expose a portion of the release layer 120. Thereafter, a seed layer 131 is formed on the first dielectric layer 134 and the seed layer 131 covers the openings 134a of the first dielectric layer 134 and the portion of the release layer 120 exposed by the openings 134a. Next, a patterned photoresist layer is formed on the first dielectric layer 134, and the openings of the patterned photoresist layer expose the openings 134a of the first dielectric layer 134 and the portion of the seed layer 131 exposed by the openings 134a. Then, electroplating is performed by utilizing the seed layer 131 as a conductive path, so as to form the patterned circuit layer 132 on the first dielectric layer 134, and the patterned circuit layer 132 fills the openings 134a of the first dielectric layer 134 to form the pads 132a. Thereafter, the patterned photoresist layer is removed and the portion of the seed layer 131 exposed by the patterned photoresist layer is etched and removed. Thus, in this embodiment, the outer surface of the pad 132a (including the seed layer 131) is coplanar with the surface of the first dielectric layer 134 to together define the first surface S1 of the redistribution layer 130. Next, the second dielectric layer 136 and the under ball metallization layer 138 are formed sequentially, and the manufacture of the redistribution layer 130 as shown in FIG. 11 may be complete.

Thereafter, as shown in FIG. 11, a chip 140 is disposed on the second surface S2 of the redistribution layer 130 by flip-chip bonding through a plurality of conductive bumps 142, and electrically connected to the patterned circuit layer 130 via the conductive bumps 142 and the under ball metallization layer 138. Then, an encapsulant 150 is formed on the second surface S2 of the redistribution layer 130 to encapsulate the chip 140 and the conductive bumps 142.

Figure 13:
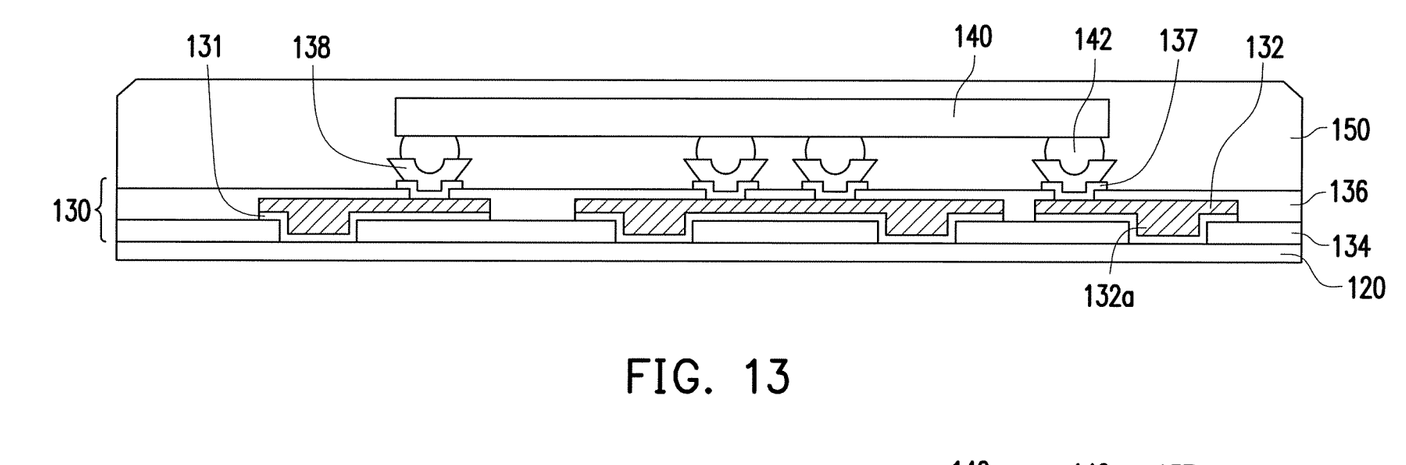
Figure 14:
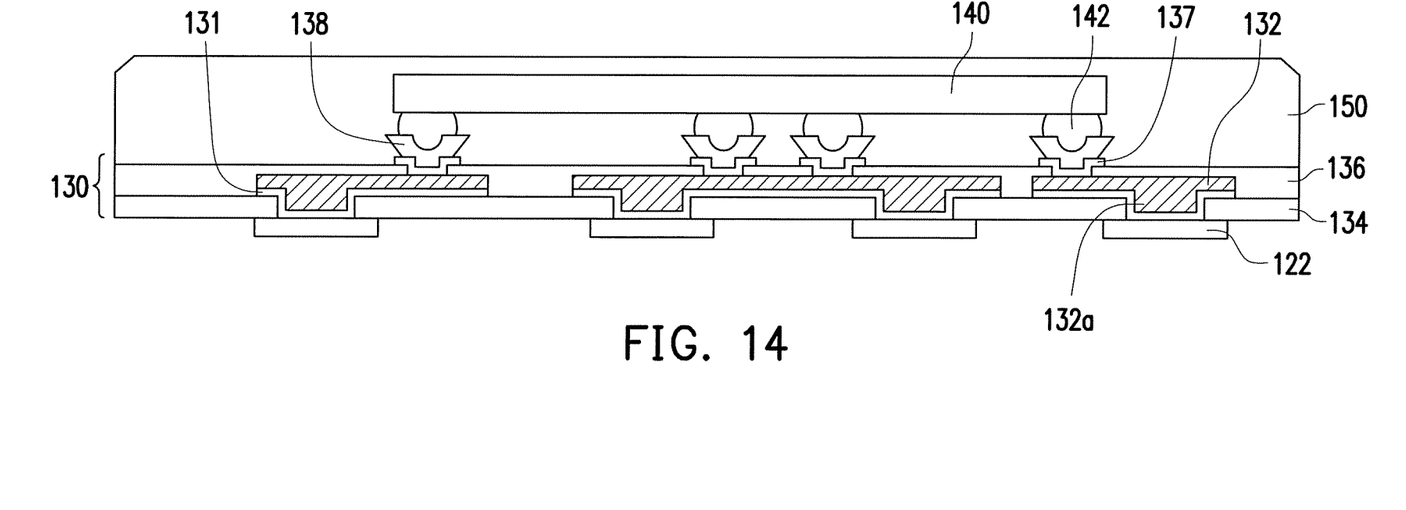

Then, referring to FIG. 13 and FIG. 14, the carrier 105 is removed and a patterning process is performed on the release layer 120, so as to form a plurality of under ball release layers 122 as shown in FIG. 14. In this embodiment, the patterning process may include laser drilling, dry etching, or wet etching. Thus, the under ball release layers 122 are located on the first surface S1 of the redistribution layer 130 and respectively cover the pads 132a, wherein each of the under ball release layers 122 covers a portion of the first dielectric layer 134. In other words, the under ball release layer 122 covers the pad 132a and covers a portion of the first dielectric layer 134 around the pad 132a.

Figure 15:
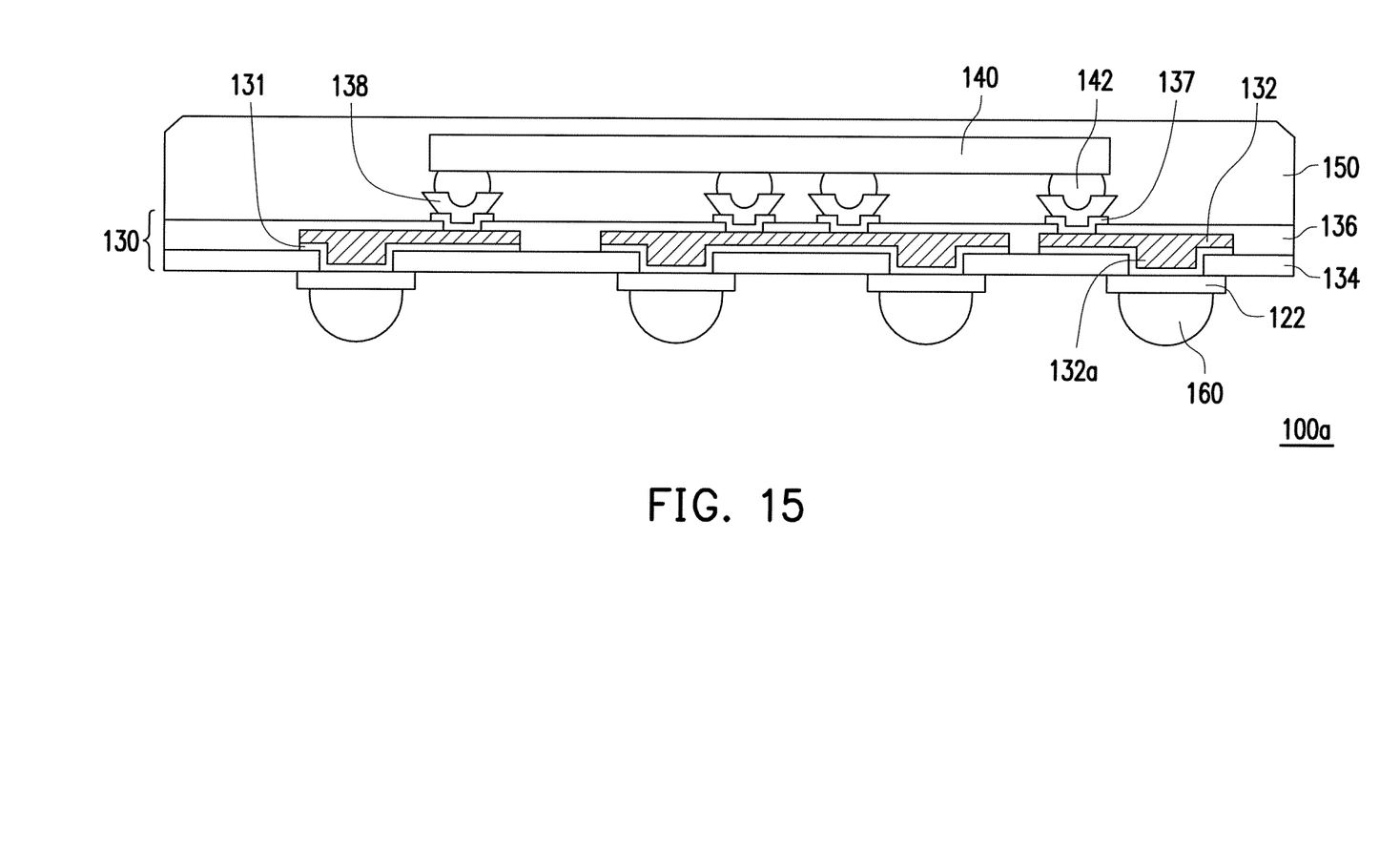

Thereafter, a plurality of solder balls 160 are formed on the under ball release layers 122 as shown in FIG. 15, and the solder balls 160 are electrically connected to the pads 132a via the under ball release layers 122. Since the under ball release layer 122 covers the pad 132a and the portion of the first dielectric layer 134 around the pad 132a, an area of a contact surface of the under ball release layer 122 in contact with the solder ball 160 is greater than an area of an outer surface of each pad 132a, and therefore the bonding area of the solder ball 160 is increased. Furthermore, a surface roughness of the under ball release layer 122 formed by sputtering is less than a surface roughness of the pad 132a formed by electroplating. Thus, the bonding strength of the solder ball 160 is enhanced, so as to facilitate ball formation in the subsequent reflow process and improve the reliability of the package structure 100a.

In conclusion, according to the package structure and the manufacturing method thereof described in the embodiments of the disclosure, the release layer is formed on the carrier first and then the redistribution layer is formed thereon. Thereafter, the release layer is patterned when the carrier is removed, so as to form a plurality of under ball release layers covering the pads of the redistribution layer. Thus, the package structure, which is manufactured by the method of forming the redistribution layer prior to disposing the chip, may include the under ball release layers that cover the pads. Moreover, since the contact area between the under ball release layer and the solder ball is greater than the area of the outer surface of the pad, the bonding area for bonding the solder ball is increased. Furthermore, the surface roughness of the under ball releaser layer formed by sputtering is less than the surface roughness of the pad formed by electroplating. Thus, the bonding strength for bonding the solder balls is enhanced to facilitate ball formation in the subsequent reflow process. Hence, the package structure and the manufacturing method of this disclosure effectively improve the reliability of the package structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A package structure, comprising:
   a redistribution layer having a first surface, a second surface opposite to the first surface, and a patterned circuit layer, wherein the patterned circuit layer comprises a plurality of pads protruding from the first surface;
   a chip disposed on the second surface and electrically connected to the patterned circuit layer;
   an encapsulant disposed on the second surface and encapsulating the chip;
   a plurality of under ball release layers respectively covering the pads protruding from the first surface, wherein a surface roughness of each of the under ball release layers is less than a surface roughness of each of the pads; and
   a plurality of solder balls respectively disposed on the under ball release layers and electrically connected to the pads.
2. The package structure according to claim 1, wherein each of the under ball release layers comprises a contact surface in contact with each of the solder balls, and each of the pads comprises an outer surface facing away from the first surface, wherein an area of the contact surface is greater than an area of the outer surface.
3. The package structure according to claim 1, wherein a material of each of the under ball release layers comprises a metal, a metal oxide, a metal alloy, or any combination of the foregoing.
4. The package structure according to claim 1, wherein the redistribution layer further comprises:
   a first dielectric layer comprising a plurality of openings and the first surface, wherein the patterned circuit layer is disposed on the first dielectric layer and the pads protrude from the first surface through the openings;
   a second dielectric layer disposed on the first dielectric layer and comprising the second surface, wherein the second dielectric layer exposes a portion of the patterned circuit layer; and
   a under ball metallization layer disposed on the second dielectric layer and electrically connected to the patterned circuit layer.
5. The package structure according to claim 4, wherein the chip is disposed on the under ball metallization layer via a plurality of conductive bumps.
6. A package structure, comprising:
   a redistribution layer comprising a first surface, a second surface opposite to the first surface, and a patterned circuit layer disposed on the first surface, wherein the patterned circuit layer comprises a plurality of pads, and an outer surface of each of the pads is coplanar with the first surface;
   a chip disposed on the second surface and electrically connected to the patterned circuit layer;
   an encapsulant disposed on the second surface and encapsulating the chip;
   a plurality of under ball release layers disposed on the first surface and respectively covering the pads; and
   a plurality of solder balls respectively disposed on the under ball release layers and electrically connected to the pads, wherein an area of a contact surface of each of the under ball release layers, which is in contact with each of the solder balls, is greater than an area of the outer surface of each of the pads.
7. The package structure according to claim 6, wherein a surface roughness of each of the under ball release layers is less than a surface roughness of each of the pads.
8. The package structure according to claim 6, wherein a material of each of the under ball release layers comprises a metal, a metal oxide, a metal alloy, or any combination of the foregoing.
9. The package structure according to claim 6, wherein the redistribution layer further comprises:
   a first dielectric layer comprising a plurality of openings, wherein the patterned circuit layer is disposed on the first dielectric layer and the pads are disposed in the openings, and the outer surface of each of the pads is coplanar with a surface of the first dielectric layer to together define the first surface;
   a second dielectric layer disposed on the first dielectric layer and comprising the second surface, wherein the second dielectric layer exposes a portion of the patterned circuit layer; and an under ball metallization layer disposed on the second dielectric layer and electrically connected to the patterned circuit layer.

10. The package structure according to claim 9, wherein each of the under ball release layers covers a portion of the first dielectric layer.

11. The package structure according to claim 9, wherein the chip is disposed on the under ball metallization layer via a plurality of conductive bumps.

* * * * *